Jan. 3, 1967 M. DAVIS ETAL 3,296,507
RUGGED MICROWAVE TUNNEL DIODE HAVING A FINE MESH SCREEN
AS ONE ELECTRODE SUPPORTED BY TWO CEMENTITIOUS BODIES
Filed April 8, 1965
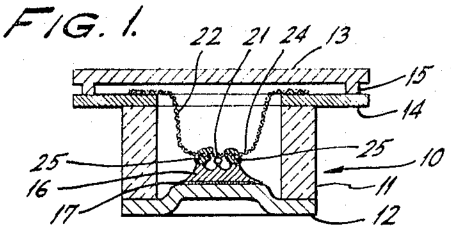
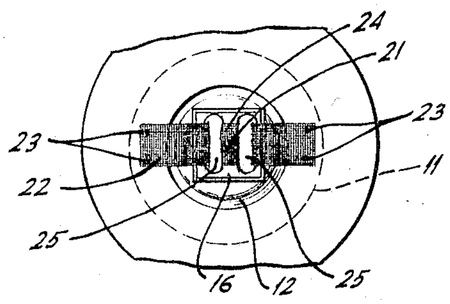
FIG. 2.
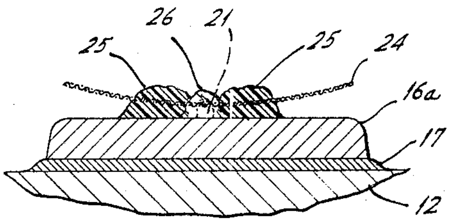
FIG. 5.
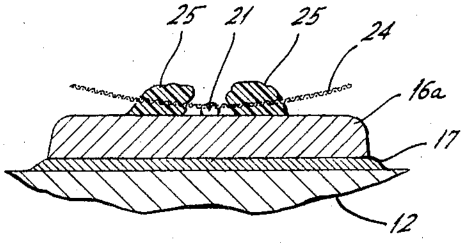
FIG. 6.
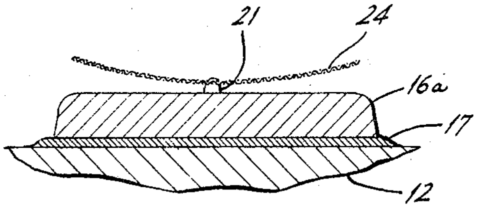
FIG. 3.
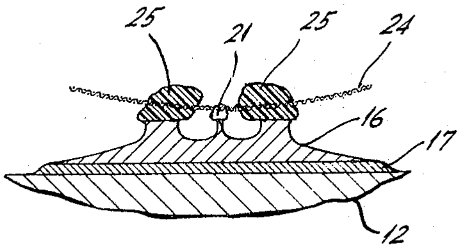
FIG. 7.
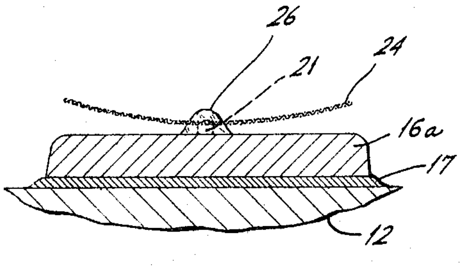
FIG. 4.
INVENTORS
MITCHELL DAVIS
RICHARD L. GOLDMAN
VICTOR C. SIRVYDAS
BY Harry W. Hargis III
AGENT 3,296,507
Patented Jan. 3, 1967

3,296,507

RUGGED MICROWAVE TUNNEL DIODE HAVING A FINE MESH SCREEN AS ONE ELECTRODE SUPPORTED BY TWO CEMENTITIOUS BODIES

Mitchell Davis, Conshohocken, Richard L. Goldman, Chalfont, and Victor C. Sirvydas, Hatboro, Pa., assignors to Philco Corporation, Philadelphia, Pa., a corporation of Delaware Filed Apr. 8, 1965, Ser. No. 446,503
9 Claims. (Cl. 317—234)

This invention relates to semiconductive devices, and more particularly to improvements in structure and fabrication of microwave tunnel diodes. The invention is particularly directed to a process for forming strain relief means for the relatively fragile junction elements of semiconductive devices, and to the resulting assembly.

In certain semiconductive devices, for example in a tunnel diode of the kind hereinafter described, it is important that the junction area be small in order that the device may operate in the microwave frequency range. To make the junction area as small as possible, it is known practice, after the junction has been formed, to reduce its area by etching until the desired diameter is attained. For example, a three mil diameter junction may be etched down to a 0.2 mil diameter or less. The resulting device comprises a column of semiconductive material of a microscopic area of only about $3\times10^{-8}$ square inch, and is, therefore, exceedingly fragile and must be carefully protected during and after the ensuing fabrication procedures.

It is a general objective of the invention to provide an improved small junction device, as well as a method for making the same, that achieves a degree of ruggedness of construction not hitherto attained.

It is a further objective of the invention to provide an improved diode package, and method for assembling the same, characterized in that relatively fragile diodes are protected against damage throughout fabrication, subsequent handling, and operation thereof.

It is a specific objective of the invention to provide a novel microwave diode assembly utilizing a relatively massive, low inductance electrode for an alloyed junction of exceedingly small area, in combination with improved means for anchoring the electrode to compensate for mechanical stresses transmitted through the electrode and tending deleteriously to affect the alloyed junction.

In achievement of the foregoing and other objectives, the invention comprises, in preferred practice thereof, provision of a junction contact upon a semiconductive body soldered to an electrically conductive end wall of a generally cylindrical electrically insulative housing structure having an electrically conductive flange along the periphery of an open end thereof. A relatively fine mesh metallic screen of elongate, generally rectangular configuration is positioned so that its central portion depends into the housing and into abutting engagement with the junction contact. The opposite end portions of the screen are electrically and mechanically connected to the flange, and its central, depending portion is soldered to the junction contact. The screen advantageously serves as a low inductance connection between the contact and the flange of the housing structure. A small quantity of removable masking material, such as a dot of molten wax of suitable type, is applied to cover the junction contact and its solder connection to the screen and is allowed to harden. A suitable cementitious material, such as epoxy resin, is disposed to opposite sides of and in contact with the wax, and in contact with the semiconductive body and the screen. The resin is allowed to cure in position, and upon curing anchors the screen strongly to the surface of the semiconductive body adjacent the region of the wax-enveloped contact. The wax is then removed by means of a suitable solvent, and the diode is etched to reduce the junction area. Final encapsulation of the diode device is accomplished by sealing a cap to the housing in accordance with known practice.

It is a feature of the invention that the epoxy resin braces the alloy junction during and subsequent to etching and rinsing operations. Also, the screen is anchored in closely spaced relation to the junction and serves as an effective strain relief means for isolating the delicate junction in the course of subsequent assembly steps as well as protecting it from mechanical and thermal shocks encountered in operation.

The manner in which the foregoing and other objectives may best be achieved will be understood from a consideration of the following description taken in light of the accompanying drawing, in which:

FIGURE 1 is an elevational showing, partly in section, of a device made in accordance with the invention;

FIGURE 2 is a plan view of the device illustrated in FIGURE 1, with an upper portion removed; and FIGURES 3, 4, 5, 6 and 7 are enlarged sectional showings of a fragmentary part of the device shown in FIGURES 1 and 2, and illustrate steps in its fabrication.

With more detailed reference to the drawing, and first to FIGURES 1 and 2, the invention is embodied in a diode device 10 including a hermetically sealed enclosure or housing comprised of a cylindrical member 11 of an insulating material, for example high alumina ceramic, closed at one end by a flanged metallic plate 12 sealed, for example by brazing, to the member 11 and at the other end by a metallic disk 13 that overlies and is welded, along a ring-shaped projection 15 thereof, to the metallic flange 14 also sealed to the member 11. The metallic plate 12 and flange 14 preferably are made of gold-plated "Kovar," an alloy of iron, cobalt, and nickel whose thermal expansion and contraction characteristics closely match those of the ceramic. The disk 13 conveniently is made of B–1113 steel, which due to its good machinability permits it to be rolled into rods capable of being readily machined into the above described disk-shaped configuration. One such suitable steel is sold under the trade name "Noleadloy."

A junction contact 21, for example a dot of tin containing an n-type dopant, is alloyed to a very small area of semiconductive body 16, for example a heavily doped p-type germanium chip or die, which is solder-bonded to the flanged plate 12 by means of solder 17, preferably a tin—1% gallium alloy. End portions of a generally rectangular screen 22, preferably of gold-plated nickel mesh .5 mil in thickness having 1.5 mil square openings, are spot welded, as seen at 23 (FIGURE 2), to the flange 14 affixed to the upper end of the housing. The central portion of the screen depends into the hollow cylindrical member 11 of the housing and includes a generally horizontal section 24 secured, as by soldering, in electrical contact with the alloyed junction contact 21.

In particular accordance with the invention, bodies 25 of a cementitious material, such as epoxy resin, are disposed to either side of and closely spaced from the alloyed junction contact, and are adherent to the semiconductive body and to the screen.

Advantageously, the electrode screen 22 is held mechanically and electrically at its ends, and mechanically in regions disposed substantially equidistantly and closely adjacent opposite sides of the relatively fragile alloyed contact. By this construction, the elements which comprise the alloyed junction are rendered highly stable and resistant to mechanical shock, while the junction is maintained free from contact with the resin. These latter considerations contribute to performance of the method aspect of the invention hereinafter to be more fully described.

Turning now to FIGURES 3 to 7, a preferred sequence of operations is illustrated for assembling the diode device, in preparation for achieving final assembly and encapsulation of the device in accordance with the invention. Referring first to FIGURE 3, the semiconductive body 16*a*, with its alloyed contact 21, is mounted upon the base 12 first by disposing the body of solder 17, as a preformed layer, between the semiconductive body and the base, followed by raising the temperature of the sub-assembly to a level just sufficient to fuse the solder and form the solder bond, without deleteriously affecting the other elements of the structure. It is of course to be understood that the elements of the housing less its cap 13 have been sub-assembled at this stage of the assembly. The gold-plated nickel screen 22 of relatively fine flexible and resilient mesh, and of elongate generally rectangular configuration, is then positioned so that its central portion depends into the housing and abuttingly engages alloyed contact 21. The ends of screen 22 are spot welded to upper flange 14 of the housing structure (see FIGURES 1 and 2), and the alloyed contact 21 may at this time be soldered to the screen where they abuttingly engage. Solder bonding of the screen to the contact may be delayed until later in the assembly as will be explained.

With reference to FIGURE 4, a small body 26 of masking material, preferably molten wax, is applied in amount just sufficient to cover the alloyed contact and its solder connection to the screen, and the wax is allowed to harden. A convenient way to apply the wax is to place a small bit above the contact and then heat the assembly to melt the wax and allow it to flow over the contact and onto surrounding portions of the germanium. A wax suitable for this purpose is sold by the James G. Biddle Co., under the trade name "Apiezon," and is soluble in trichloroethylene which property aids in complete removal of the wax as will be described later. As illustrated in FIGURE 5, bodies of epoxy resin 25, or similar suitable cementitious material, are then disposed to opposite sides of and in contact with hardened wax 26, semiconductive body 16*a*, and horizontal section 24 of screen 22. As shown in FIGURE 2, the resin is applied in strips transversely to the fine mesh screen, the openings of which are sufficiently large to permit flow of the somewhat viscous epoxy resin therethrough. In this way a firm bond may be formed between the screen and resin when it cures. It will be appreciated that the wax in effect serves as a mask preventing flow of the resin onto the contact 21 and providing for a very close spacing between the resin and the contact. Resin 25 is then allowed to cure in position, whereby to anchor screen 22 strongly to the surface of the semiconductive body, adjacent the wax-enveloped alloyed contact 21. An epoxy resin sold under the trademark "Hysol," and available from Houghton Laboratories, has been found suitable for purposes of the invention.

The mask-like coating of wax 26 is removed by immersing the sub-assembly in a suitable solvent, such for example as the aforementioned trichloroethylene, leaving the structure illustrated in FIGURE 6. If desired, solder bonding of the screen to the junction contact may be carried out after removal of the wax, provided that a suitably high temperature resistant epoxy resin or like material has been used. After removal of the cover of wax, the diode is subjected to a conventional etching process to reduce the alloyed junction area by selectively removing a quantity of germanium from the chip 16*a*, leaving the structure shown in FIGURE 7, in which portions of the germanium chip have been etched away to leave the body 16 having a very small and fragile column of germanium of microscopic proportions supporting the contact area. Final encapsulation is accomplished by projection welding the ring portion 15 of disk 13 to flange 14, as illustrated in FIGURE 1.

In contrast with the above disclosed technique, prior art devices have been characterized by relatively wide gaps between the junction contact and the electrode support structure. These wide gaps render the structure less mechanically stable than a device made in accordance with the present invention. Moreover, in practise of the present invention, use of two symmetrically disposed bodies of epoxy resin, which cure substantially simultaneously, tends to equalize stresses on the junction contact area during shrinkage of the resin as it cures.

While the invention has been described in reference to a particular embodiment thereof, it will be understood that it has applicability to fabrication of devices of configurations other than that illustrated, and that variations may be made in specific materials without departing from the teaching of the invention.

We claim:

1. In a semiconductive device: a body of semiconductive material; an electrode of the area type forming a junction with a relatively small surface area of said semiconductive material, said surface area being disposed upon a column of said material which has been reduced to microscopic proportions; a flexible and resilient, electrically conductive, elongate unitary member supported in the regions of its end portions and having a central portion mechanically and electrically bonded with said electrode; and a pair of individual bodies of electrically non-conductive support material, each disposed upon said body of semiconductive material in opposed regions closely spaced from said electrode, said column supporting the electrode, and said support material embedding spaced portions of said elongate member to brace the same in its recited connection with said electrode.

2. A device according to claim 1, and characterized in that said elongate member comprises a generally rectangular sheet of porous material, and said bodies of said support material are cementitious and extend through openings of said porous material.

3. A device according to claim 2 in which said porous material is a relatively fine mesh screen.

4. A device according to claim 1 characterized in that it comprises a microwave tunnel diode and said electrode junction is of the alloyed type.

5. A device according to claim 2, and characterized in that said elongate member is of generally U-shaped configuration and said end portions comprise the leg portions, and said central portion comprises the loop portion of said member.

6. In a microwave tunnel diode device of the type including a semiconductive chip disposed upon an electrically conductive base, a hollow cylindrical member of electrically insulative material surrounding said chip and hermetically sealed to said base, an electrically conductive cover hermetically sealed to said cylindrical member, a junction contact disposed upon a central surface portion of said chip disposed atop a relatively small necked-down portion of the latter, and a relatively fine mesh, elongate screen having its end portions disposed in electrical contact with said cover and a central portion extending into said cylindrical member and both mechanically and electrically engaged with said contact, the improvement which comprises a pair of bodies of cementitious material adherent to surface portions of said chip disposed to opposite sides of said contact and extending through openings in and adherent to solid portions of said screen in substantial equidistant spaced relation as respects said contact.

7. A device according to claim 6, and characterized in that said bodies of cementitious material are of elongate, strip form and extend transversely of said elongate screen.

8. In a microwave tunnel diode device of the type including a semiconductive chip disposed upon an electrically conductive base, a junction contact disposed upon a surface portion of said chip and supported by a very minute necked-down portion of the latter, said necked-down portion being undercut with respect to said contact, a relatively fine mesh, elongate screen having mechanically supported end portions disposed to opposite sides of said contact and a central span portion disposed in mechanical and electrical engagement with said contact, and a pair of bodies of cementitious material each adherent to portions of said chip and disposed to opposite sides of said contact in substantially equidistant, relatively closely spaced relation thereto, said cementitious material extending through openings in said central span portion of said screen and adherent to solid portions thereof, said bodies of cementitious material serving as strain relief means for the region of engagement of said screen with said contact, with respect to forces exerted on said screen through said mechanically supported end portions.

9. A device according to claim 8 and characterized in that said bodies of cementitious material are elongate, are substantially parallel with one another, and extend transversely to said elongate screen.

References Cited by the Examiner

UNITED STATES PATENTS

| | | | |
|---|---|---|---|
| 3,001,113 | 9/1961 | Mueller | 317—236 |
| 3,030,557 | 4/1962 | Dermit | 317—234 |
| 3,221,277 | 11/1965 | Hauer | 333—83 |

JOHN W. HUCKERT, *Primary Examiner.*

M. EDLOW, *Assistant Examiner.*